United States Patent
Tsukamoto

(10) Patent No.: US 9,100,036 B2
(45) Date of Patent: Aug. 4, 2015

(54) RECEIVING DEVICE AND DATA INTERPOLATION PROCESSING METHOD

(71) Applicant: FUJITSU LIMITED, Kawasaki-shi, Kanagawa (JP)

(72) Inventor: Sanroku Tsukamoto, Setagaya (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/477,674

(22) Filed: Sep. 4, 2014

(65) Prior Publication Data

US 2015/0103962 A1   Apr. 16, 2015

(30) Foreign Application Priority Data

Oct. 10, 2013   (JP) .................................. 2013-213143

(51) Int. Cl.
*H04L 7/00* (2006.01)
*H03M 1/12* (2006.01)

(52) U.S. Cl.
CPC .................................. *H03M 1/1255* (2013.01)

(58) Field of Classification Search
CPC .. H03M 1/1255; H03M 7/091; H04L 7/0337; H04L 7/0334; H04L 7/033; H04L 7/0029; H03H 17/0664; H03H 17/0657; H03H 17/0671; H03H 17/0685
USPC .......... 375/355, 357, 370, 371, 373; 327/155, 327/156; 708/313, 290; 341/155, 166
See application file for complete search history.

(56) References Cited

U.S. PATENT DOCUMENTS

| | | | | |
|---|---|---|---|---|
| 5,903,232 A | * | 5/1999 | Zarubinsky et al. | 341/61 |
| 6,570,523 B1 | * | 5/2003 | Bacrania et al. | 341/155 |
| 6,711,597 B1 | * | 3/2004 | O'Donnell | 708/290 |
| 7,668,249 B1 | * | 2/2010 | Khlat | 375/261 |
| 8,385,490 B2 | * | 2/2013 | Lee et al. | 375/350 |
| 8,791,735 B1 | * | 7/2014 | Shibasaki | 327/156 |
| 8,854,238 B2 | * | 10/2014 | Nakamura | 341/61 |
| 8,860,477 B2 | * | 10/2014 | Hashida | 327/155 |
| 2006/0013349 A1 | | 1/2006 | Koh et al. | |
| 2008/0001797 A1 | * | 1/2008 | Aziz et al. | 341/118 |
| 2009/0322418 A1 | * | 12/2009 | Burke | 327/552 |
| 2010/0189207 A1 | * | 7/2010 | Jibry | 375/371 |
| 2012/0140811 A1 | | 6/2012 | Shibasaki | |

FOREIGN PATENT DOCUMENTS

JP   2006-033824 A   2/2006
JP   2012-124593 A   6/2012

OTHER PUBLICATIONS

Yoshiyasu Doi et al., "32Gb/s Data-Interpolator Receiver with 2-Tap DFE in 28nm CMOS", IEEE International Solid-State Circuits Conference, Feb. 2013.

* cited by examiner

*Primary Examiner* — Phuong Phu
(74) *Attorney, Agent, or Firm* — Arent Fox LLP

(57) ABSTRACT

There is provided a receiving device includes: a plurality of interpolation unit circuits, each interpolation unit circuit configured to perform interpolation processing of a sampling value obtained by asynchronously sampling input data, based on an interpolation ratio, so that sampling data synchronous with the input data and continuous in time is generated, wherein one of the interpolation unit circuits is provided in parallel with another of the interpolation unit circuits for a channel previous to a channel in which switching of the interpolation ratio is performed.

5 Claims, 17 Drawing Sheets

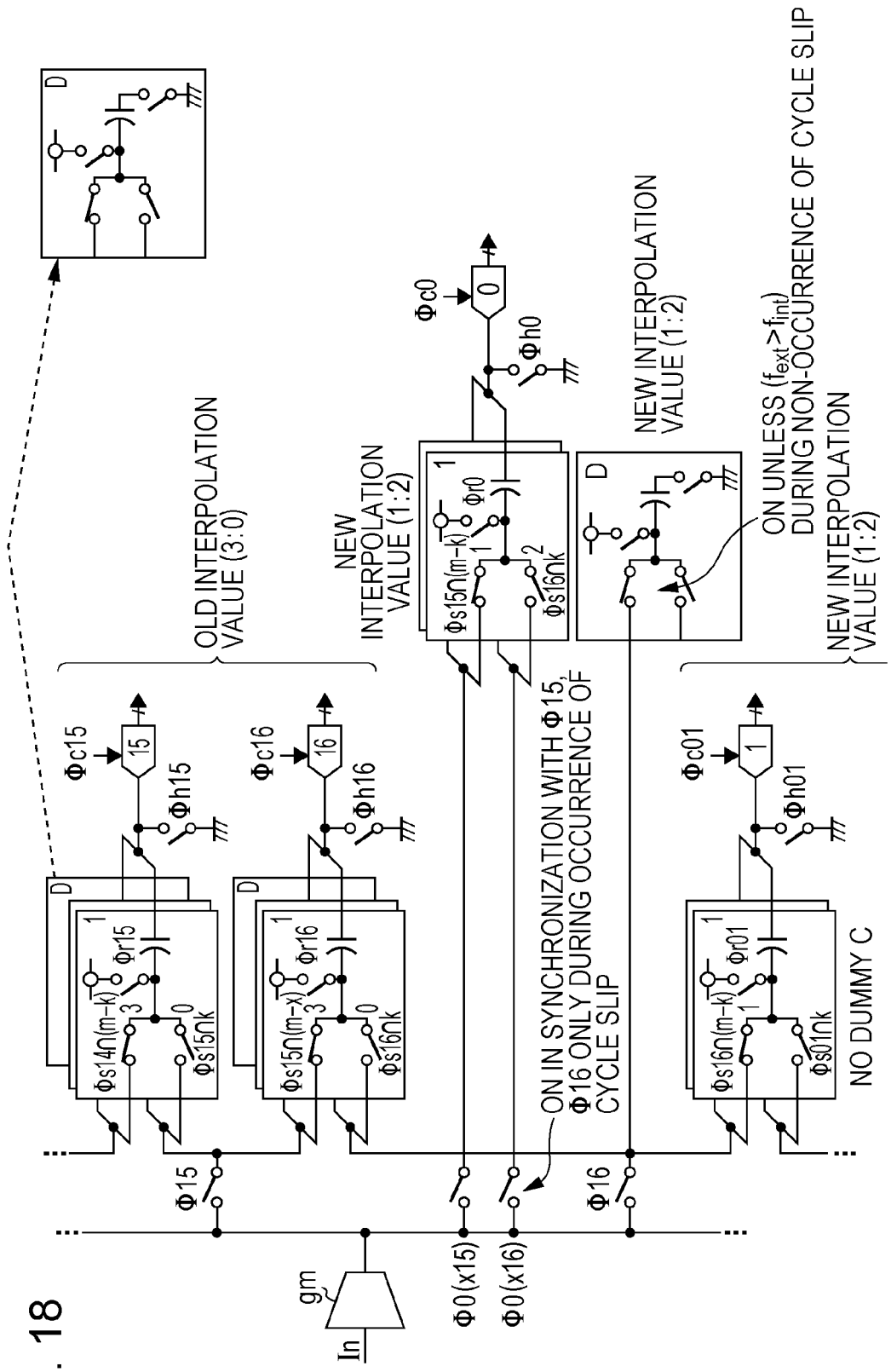

RECEIVING DEVICE AND DATA INTERPOLATION PROCESSING METHOD

CROSS-REFERENCE TO RELATED APPLICATION

This application is based upon and claims the benefit of priority of the prior Japanese Patent Application No. 2013-213143, filed on Oct. 10, 2013, the entire contents of which are incorporated herein by reference.

FIELD

The embodiments discussed herein are related to a receiving device and a data interpolation processing method.

BACKGROUND

In wire line communication between boards, such as servers, and between parts mounted on boards, the data rate of transmitting and receiving signals is increasing. In reception circuits that receive such high-speed data, asynchronous sampling, in which input data is sampled not in synchronization with the phase of the input data, is more effective than synchronous sampling, in which input data is sampled in synchronization with the phase of the input data.

An asynchronous sampling reception circuit interpolates data asynchronously sampled, thereby generating reception data. As a conventional technique, there has been proposed a technique in which, after asynchronous sampling, analog linear interpolation processing is performed, and, by using an analog-to-digital (A/D) converter with a low resolution, it is determined whether data is "1" or "0".

Y. Doi et al., "32 Gb/s Data-Interpolator Receiver with 2-Tap DFE in 28 nm CMOS", IEEE International Solid-State Circuits Conference, February 2013 is an example of the related art.

SUMMARY

According to an aspect of the invention, a receiving device includes: a plurality of interpolation unit circuits, each interpolation unit circuit configured to perform interpolation processing of a sampling value obtained by asynchronously sampling input data, based on an interpolation ratio, so that sampling data synchronous with the input data and continuous in time is generated, wherein one of the interpolation unit circuits is provided in parallel with another of the interpolation unit circuits for a channel previous to a channel in which switching of the interpolation ratio is performed.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 18 illustrates a circuit configuration of a data interpolation unit array.

DESCRIPTION OF EMBODIMENTS

In an asynchronous sampling reception circuit, for example, virtual data corresponding to one ideal timing is generated based on an interpolation ratio from two pieces of asynchronously sampled data. However, in a conventional asynchronous sampling reception circuit, there are some cases where, at a timing when the interpolation ratio is switched, a cycle slip (in which, by a state in a specific cycle, operations properly working in the other cycles do not properly function) occurs, resulting in a lack of data.

Figure 1:
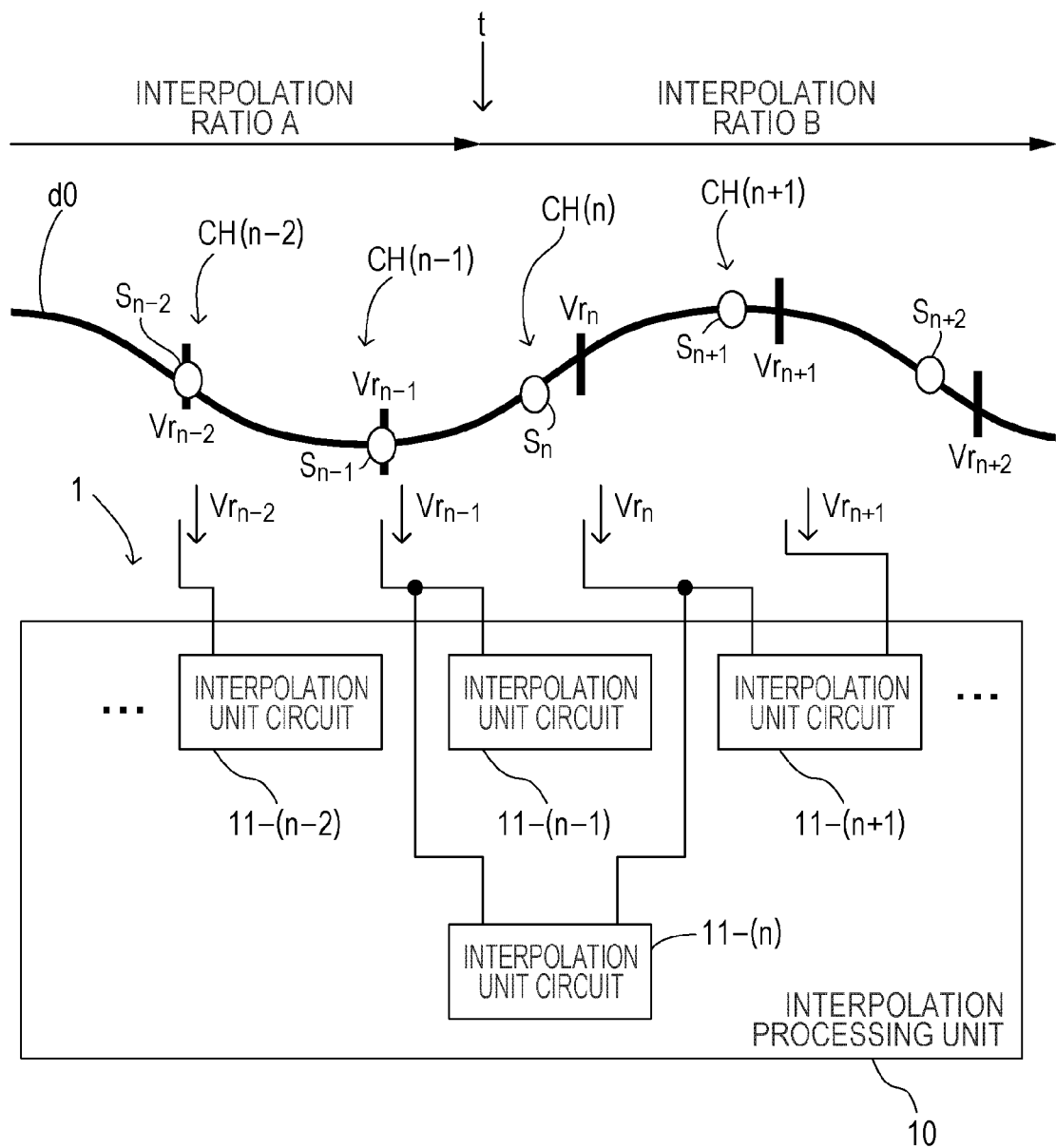
FIG. 1 is a diagram illustrating an example of a configuration of a receiving device.

Hereinbelow, a technique for avoiding a situation in which there is a lack of data resulting from the cycle slip will be described with reference to the accompanying drawings. FIG. 1 is a diagram illustrating an example of a configuration of a receiving device. A receiving device 1 includes an interpolation processing unit 10. The interpolation processing unit 10 includes interpolation unit circuits 11-($n$−2), 11-($n$−1), 11-($n$), 11-($n$+1), . . . (generically referred to as "interpolation unit circuits 11").

The interpolation unit circuits 11 each perform interpolation processing of a sampling value obtained by asynchronously sampling input data d0, based on an interpolation ratio, so that sampling data synchronous with the input data d0 and continuous in time is generated for every channel. The interpolation unit circuits 11 are provided in parallel for a channel previous to a channel in which switching of the interpolation ratio is performed.

In FIG. 1, for the input data d0, it is assumed that, before a point in time t, asynchronous sampling is performed at an interpolation ratio A for every channel, and, after the point in time t, asynchronous sampling is performed at an interpolation ratio B for every channel.

The interpolation unit circuit 11-($n$−2) performs interpolation processing of a sampling value $Vr_{n-2}$ obtained by asynchronously sampling the input data d0, based on the interpolation ratio A, thereby generating sampling data $S_{n-2}$ of a channel CH (n−2) synchronous with the input data d0.

The interpolation unit circuit 11-(n−1) performs interpolation processing of a sampling value $Vr_{n-1}$ obtained by asynchronously sampling the input data d0, based on the interpolation ratio A, thereby generating sampling data $S_{n-1}$ of a channel CH (n−1) synchronous with the input data d0.

The interpolation unit circuit 11-(n+1) performs interpolation processing of sampling values $Vr_n$ and $Vr_{n-1}$ obtained by asynchronously sampling the input data d0, based on the interpolation ratio B, thereby generating sampling data $S_{n+1}$ of a channel CH (n+1) synchronous with the input data d0.

Here, in the case where, in the course of performing time-series sampling, the interpolation ratio is switched from the interpolation ratio A to the interpolation ratio B in a channel CH (n) positioned at a point in time t, there is a possibility that the cycle slip will occur and result in a lack of sampling data $S_n$ synchronous with the input data d0.

For dealing with this, in the receiving device 1, the interpolation unit circuits 11 are provided in a parallel configuration for the channel CH (n−1) previous to the channel CH (n) in which switching of the interpolation ratio is performed. In this example, the interpolation unit circuit 11-(n−1) and the interpolation unit circuit 11-(n) are provided in parallel.

In this case, the interpolation unit circuit 11-(n) performs interpolation processing of sampling values $Vr_{n-1}$ and $Vr_n$ obtained by asynchronously sampling the input data d0, based on the interpolation ratio B, thereby generating sampling data $S_n$ of the channel CH(n) synchronous with the input data d0. In this way, the sampling data $S_n$ may be generated in the channel positioned at the timing of switching of the interpolation ratio.

In this way, in the receiving device 1, the interpolation unit circuits 11 for the channel previous to the channel in which switching of the interpolation ratio is performed are provided in a parallel configuration, and perform interpolation processing of asynchronous sampling values of input data based on interpolation ratios, thereby generating data synchronous with input data for every channel. This may avoid a situation in which there is a lack of data resulting from a cycle slip.

Figure 2:
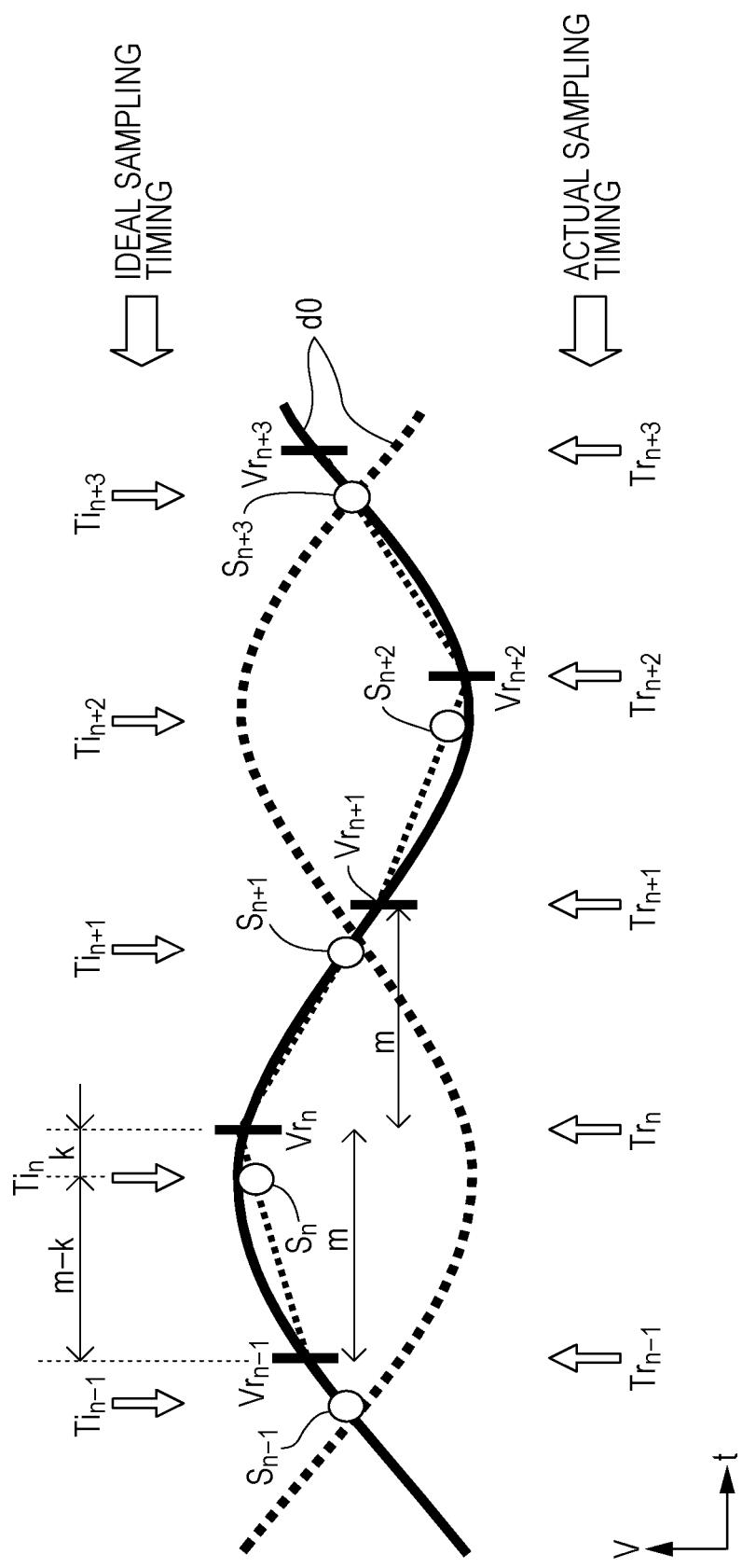
FIG. 2 is an illustration for explaining data interpolation processing.

Next, data interpolation processing and conventional issues will be described with reference to FIG. 2 to FIG. 8. FIG. 2 is an illustration for explaining data interpolation processing. The vertical axis represents the voltage, and the horizontal axis represents time. Note that the solid line and the dotted line of the input data d0 represent polarity states opposite to each other.

In the data interpolation processing, first, at a timing that is not synchronous with the input data d0, the input data d0 is sampled (actual sampling), so that actual sampling data is acquired, that is, the voltage value of actual sampling data is acquired.

Then, using two pieces of actual sampling data, data (virtual sampling data) corresponding to data that is sampled at an ideal timing synchronous with the input data d0 is generated through a composition process by the interpolation processing. That is, the voltage value of virtual sampling data is acquired.

In the case of FIG. 2, sampling timings synchronous with the input data d0 are referred to as ideal sampling timings $Ti_{n-1}$, $Ti_n$, $Ti_{n+1}$, $Ti_{n+2}$, $Ti_{n+3}$, .... Timings that are asynchronous with the input data d0 and are actually sampled are referred to as actual sampling timings $Tr_{n-1}$, $Tr_n$, $Tr_{n+1}$, $Tr_{n+2}$, $Tr_{n+3}$, ....

Meanwhile, the sampling period of the actual sampling timing of one channel is assumed to be m (>0). At this time, for example, assuming that the time interval between the ideal sampling timing $Ti_n$ and the actual sampling timing $Tr_n$ is k (0≤k≤m), the time interval between the actual sampling timing $Tr_{n-1}$ and the ideal sampling timing $Ti_n$ is m−k.

For the input data d0 indicated by the solid line, the value (voltage value) at the actual sampling timing $Tr_{n-1}$ is denoted by $Vr_{n-1}$, and the value at the actual sampling timing $Tr_n$ is denoted by $Vr_n$.

At this time, virtual sampling data $S_n$ (the voltage value of $S_n$) of the input data d0 at the ideal sampling timing $Ti_n$ positioned between the actual sampling timings $Tr_{n-1}$ and $Tr_n$ is determined by the following formula (1).

$$S_n = (k \cdot Vr_{n-1} + (m-k) \cdot Vr_n)/m \tag{1}$$

Similarly, virtual sampling data $S_{n+1}$ of the input data d0 at the ideal sampling timing $Ti_{n+1}$ positioned between the actual sampling timings $Tr_n$ and $Tr_{n+1}$ is determined by the following formula (1-1).

$$S_{n+1} = (k \cdot Vr_n + (m-k) \cdot Vr_{n+1})/m \tag{1-1}$$

Subsequent pieces of virtual sampling data $S_{n+2}$, $S_{n+3}$, ... are obtained similarly.

In this way, an appropriate interpolation ratio (k:(m−k) in the above example) at which one ideal sampling data is obtained from two pieces of actual sampling data is set. Then, as in formula (1) and formula (1-1), an interpolation operation is performed using an interpolation coefficient k and an interpolation coefficient (m−k) of the interpolation ratio.

Thus, from the sampling data asynchronous with the input data d0, virtual sampling data corresponding to data to be sampled at a timing synchronous with the input data d0 may be acquired.

Figure 3:
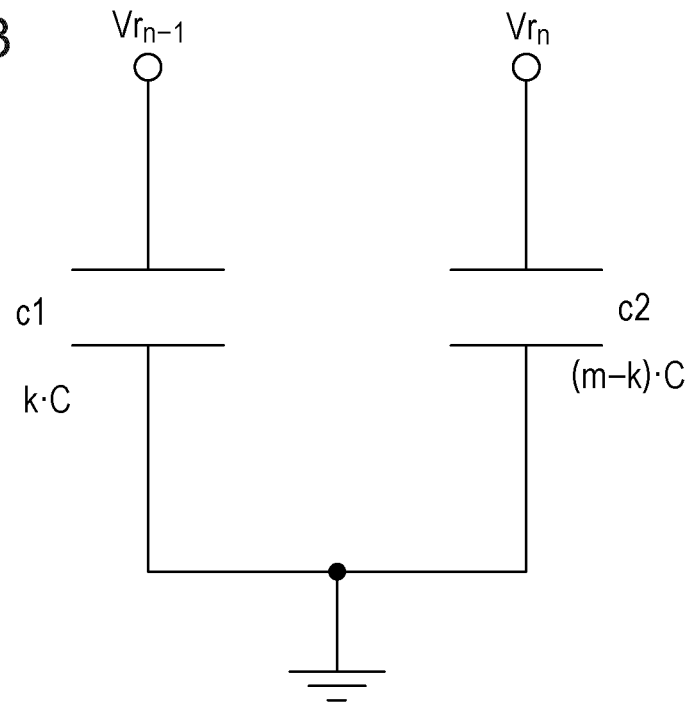
FIG. 3 is a circuit diagram for explaining a circuit that implements data interpolation processing.
Figure 4:
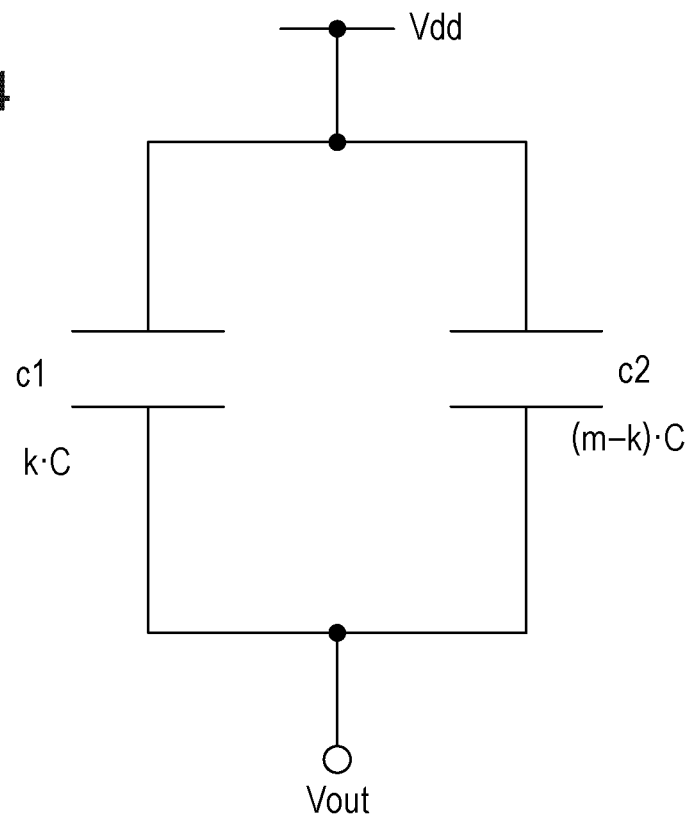
FIG. 4 is a circuit diagram for explaining a circuit that implements data interpolation processing.

Next, circuit configurations for implementing the aforementioned data interpolation processing will be described with reference to FIG. 3 to FIG. 5. FIG. 3 and FIG. 4 are circuit diagrams for explaining circuits that implement data interpolation processing. In the circuit of FIG. 3, a sampling voltage value $Vr_{n-1}$ of the input data d0 at the actual sampling timing $Tr_{n-1}$ is applied to one end of a capacitor c1. A sampling voltage value $Vr_n$ of the input data d0 at the actual sampling timing $Tr_n$ is applied to one end of a capacitor c2.

The other ends of the capacitors c1 and c2 are connected with GND. Note that the capacitance of the capacitor c1 is assumed to be k·C, and the capacitance of the capacitor c2 is assumed to be (m−k)·C. Here, since the relationship among the electric charge Q, the capacitance C, and the voltage V of a capacitor is Q=C·V, an electric charge Q1 of the capacitor c1 is Q1=k·C·$Vr_{n-1}$, and an electric charge Q2 of the capacitor c2 is Q2=(m−k)·C·$Vr_n$.

In the circuit of FIG. 4, one end of the capacitor c1 and one end of the capacitor c2 are connected with each other, and are pulled up to a power supply voltage Vdd. The other ends of the capacitors c1 and c2 are connected with each other and are connected with a Vout terminal.

The capacitors c1 and c2 are connected in parallel, and the total combined capacitance of the capacitors c1 and c2 is k·C+(m−k)·C=m·C. The voltage drop is Vdd−Vout, and therefore the total combined electric charge Qt of the capacitors c1 and c2 is Qt=m·C·(Vdd−Vout).

Here, according to the law of conservation of charge, the total sum of the electric charge Q1 of the capacitor c1 and the electric charge Q2 of the capacitor c2 in the circuit of FIG. 3 is equal to the total combined electric charge Qt of the capacitors c1 and c2 in the circuit of FIG. 4 such that Qt=Q1+Q2. Simplifying Qt=Q1+Q2 gives the following equation (1a).

$$Vdd - Vout = (k \cdot Vr_{n-1} + (m-k) \text{ and } Vr_n)/m \tag{1a}$$

Accordingly, if (Vdd−Vout) on the left side is replaced with $S_n$, the same formula as the above formula (1) is given. This proves that it is possible to perform analog linear interpolation processing utilizing the capacitor capacitances.

Figure 5:
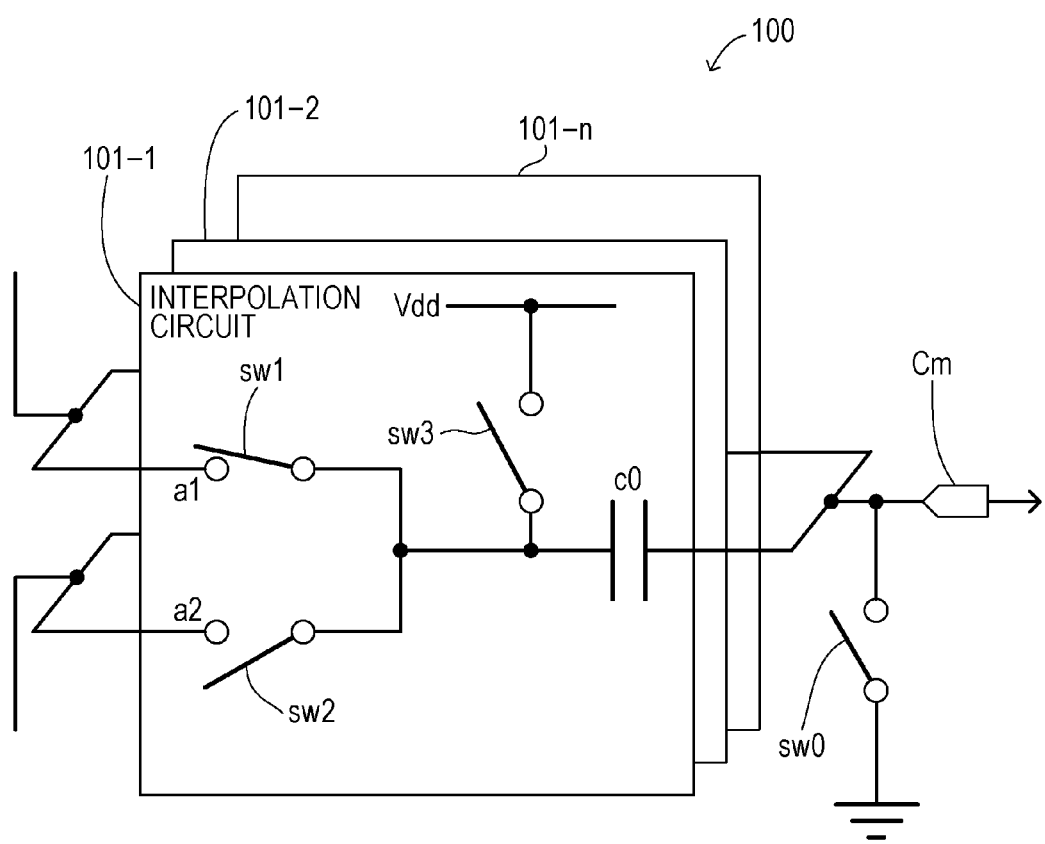
FIG. 5 is a diagram illustrating an example of a circuit configuration for implementing data interpolation processing.

FIG. 5 is a diagram illustrating an example of a circuit configuration for implementing data interpolation processing. A data interpolation processing circuit 100 includes interpolation circuits 101-1 to 101-n, a switch sw0, and a comparator Cm.

The interpolation circuit 101-1 includes switches sw1 to sw3 and a capacitor c0. A common terminal for the switch sw1 and the switch sw2 is connected with a common terminal of the switch sw3 and with one end of the capacitor c0.

When the switch sw1 is turned on, the switch terminal of the switch sw1 is connected with a data input terminal a1, and when the switch sw2 is turned on, the switch terminal of the switch sw2 is connected with a data input terminal a2. Additionally, when the switch sw3 is turned on, the switch terminal of the switch sw3 is connected with the power supply Vdd.

When the switch sw0 is turned off, the other end of the capacitor c0 is connected with a capacitor mounted in another interpolation circuit and with the input terminal of the comparator Cm. When the switch sw0 is turned on, the other end of the capacitor c0 is connected with a capacitor mounted in another interpolation circuit, with the input terminal of the comparator Cm, and with GND.

The interpolation circuits 101-2 to 101-n have configurations similar to the configuration of the interpolation circuit 101-1. Here, if n=32 and there are 32 interpolation circuits, 32 gray-scale virtual sampling may be achieved. Note that the comparator Cm generates a reference voltage inside thereof and compares the reference voltage with the voltage value of virtual sampling data to thereby determine whether data is "1" or "0". The comparator Cm may be implemented by, for example, an A/D converter with a low resolution.

Figure 6:
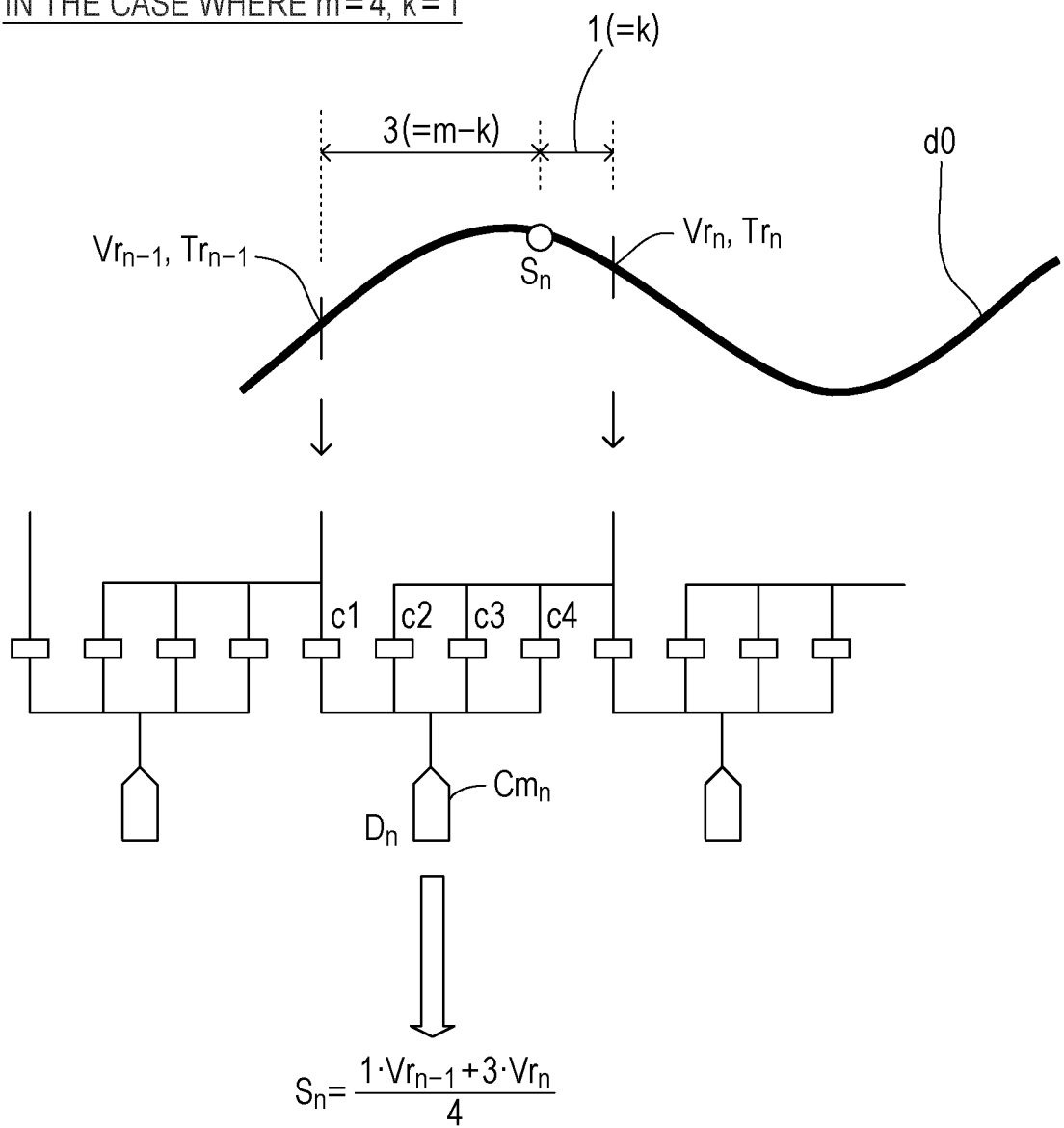
FIG. 6 is an illustration for explaining operations of setting an interpolation ratio.
Figure 7:
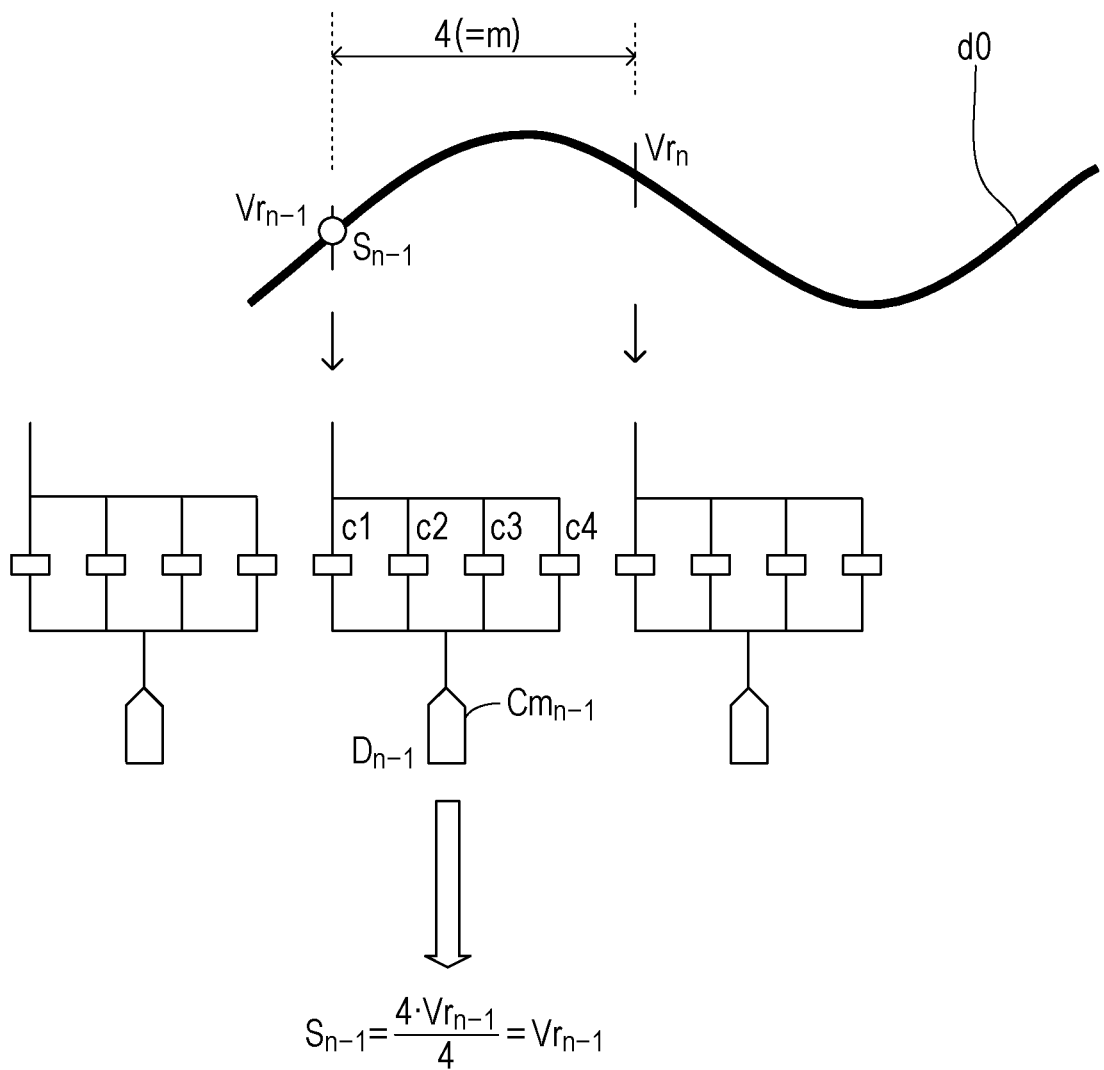
FIG. 7 is an illustration for explaining operations of setting an interpolation ratio.

FIG. 6 and FIG. 7 are illustrations for explaining operations of setting interpolation ratios. In each of the drawings, below the input data d0, data interpolation processing units that are in a schematic form of a data interpolation processing circuit are illustrated. Each data interpolation processing unit includes a capacitor array, which contains four capacitors (capacitors c1 to c4), and a comparator $Cm_n$ (in the drawings, switches are removed). Note that all the capacitances of the capacitors c1 to c4 of the capacitor array are assumed to be 1.

Ideal sampling data is assumed to be obtained in a section (channel) between the data values $Vr_{n-1}$ and $Vr_n$ of the input data d0, at each of actual sampling timings $Tr_{n-1}$ and $Tr_n$.

FIG. 6 illustrates an interpolation state (switching state) when m=4 and the interpolation ratio is set to 1:3 (m=4, k=1). The electric charge of the capacitor c1 is assumed to be $Q_{c1}$, and the total combined electric charge of the capacitors c2 to c4 is assumed to be $Q_{c2-c4}$.

At this time, a voltage $Vr_{n-1}$ is applied to the capacitor c1, and therefore $Q_{c1}=1\cdot Vr_{n-1}$. A voltage $Vr_n$ is applied to the capacitors c2 to c4, and therefore $Q_{c2-c4}=3\cdot Vr_n$. Accordingly, virtual sampling data $S_n$ is calculated by $S_n=(1\cdot Vr_{n-1}+3\cdot Vr_n)/4$.

Note that the comparator $Cm_n$ determines whether data is "1" or "0" by comparing the voltage value of the virtual sampling data $S_n$ with the reference voltage in the inside, and outputs data $D_n$.

FIG. 7 illustrates a data interpolation state when m=4 and the interpolation ratio is set to 4:0 (m=4, k=0). The total combined electric charge of the capacitors c1 to c4 is assumed to be $Q_{c1-c4}$.

At this time, a voltage $Vr_{n-1}$ is applied to the capacitors c1 to c4, and therefore $Q_{c1-c4}=4\cdot Vr_{n-1}$. Accordingly, the virtual sampling data $S_{n-1}$ is such that $S_{n-1}=(4\cdot Vr_{n-1})/4=Vr_{n-1}$, and the virtual sampling data $S_n q$ has the same value as the actual sampling data $Vr_{n-1}$.

Also, a comparator $Cm_{n-1}$ determines whether data is "1" or "0" by comparing the voltage value of the virtual sampling data $S_{n-1}$ with the reference voltage in the inside, and outputs data $D_{n-1}$.

Next, the case where a cycle slip occurs, resulting in a lack of data, will be described. As described above, data interpolation processing generates virtual sampling data from asynchronously sampled data, based on an interpolation ratio, and thereafter it is determined whether virtual sampling data is "1" or "0".

In this case, in order to bring virtual sampling data close to ideal sampling data, the interpolation ratio is set to an appropriate ratio in accordance with variations in the frequency of input data during the system operation so as to cause the frequency of actual sampling to be variable. However, in conventional data interpolation processing, there are some cases where, at a timing when the interpolation ratio is switched, a cycle slip occurs, resulting in a lack of data.

Figure 8:
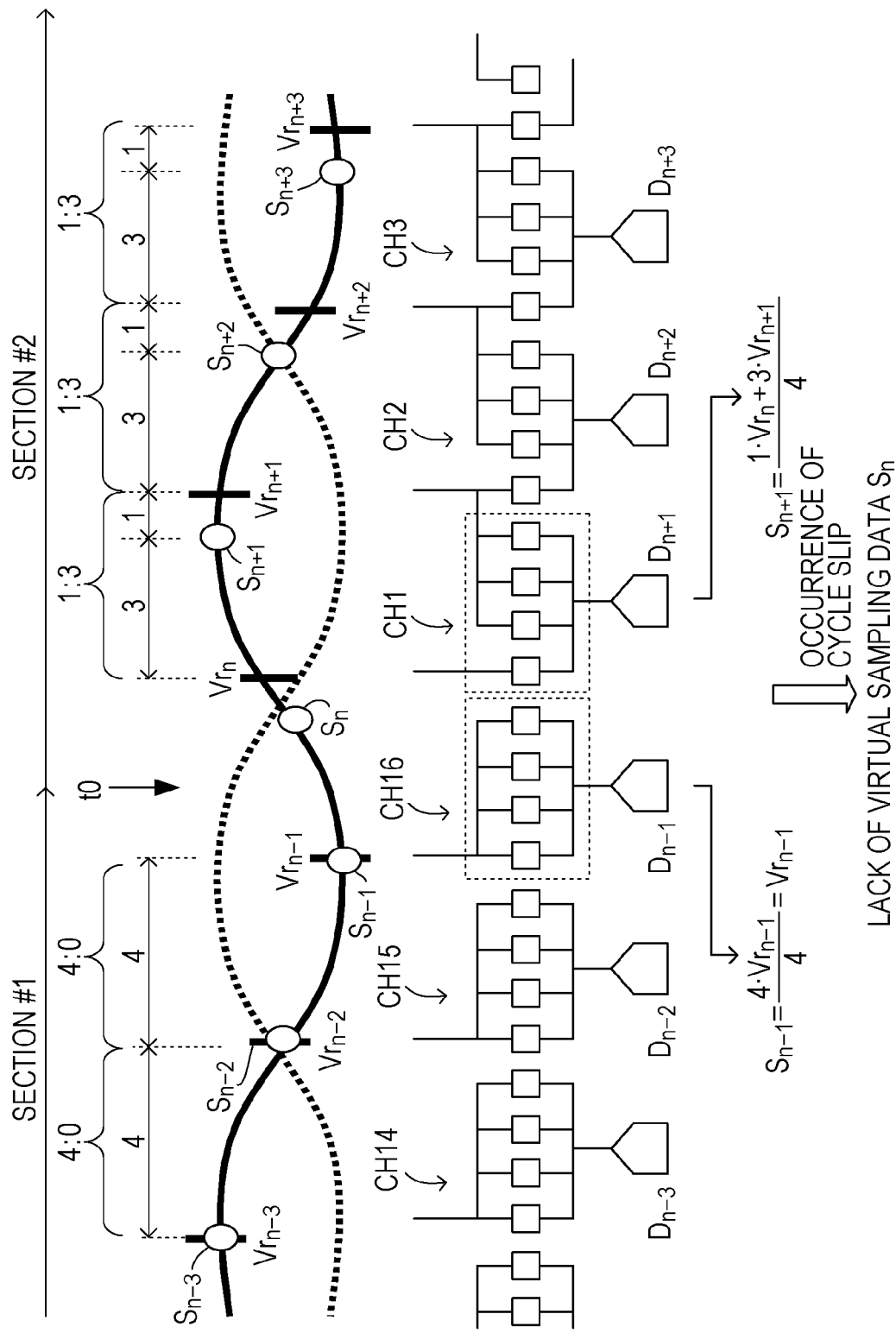
FIG. 8 is an illustration for explaining a phenomenon in which a cycle slip occurs, resulting in a lack of data.

FIG. 8 is a diagram for explaining a phenomenon in which a cycle slip occurs, resulting in a lack of data. It is assumed that, during system operation, a frequency $f_{ext}$ of the input data d0 varies in such a manner that the frequency $f_{ext}$ is faster than a sampling frequency $f_{int}$ at which the input data d0 has been sampled ($f_{ext}>f_{int}$), and therefore the interpolation ratio is changed.

In this case, it is assumed that actual sampling at an interpolation ratio of 4:0 (m=4, k=0) is performed in a section #1 before a point in time t0. It is also assumed that the interpolation ratio after the change is set after the point in time t0, and actual sampling at an interpolation ratio of 1:3 (m=4, k=1) is performed in a section #2 after the point in time t0.

In the section #1, the interpolation ratio is 4:0. Accordingly, in channels CH14, CH15, and CH16, based on the total combined electric charge of four capacitors of the capacitor array of each channel as illustrated in FIG. 7, actual sampling data and virtual sampling data have an equal value. That is, actual sampling-data $Vr_{n-3}$, $Vr_{n-2}$, and $Vr_{n-1}$ are equal to virtual sampling data $S_{n-3}$, $S_{n-2}$, and $S_{n-1}$, respectively.

In the section #2, the interpolation ratio is 1:3. Accordingly, in the channels CH1, CH2, and CH3, based on the electric charge of one capacitor of the capacitor array and the total combined electric charge of three capacitors of each channel as illustrated in FIG. 6, one piece of virtual sampling data is obtained from two pieces of actual sampling data.

That is, the virtual sampling $S_{n+1}$ is $S_{n+1}=(1\cdot Vr_n+3\cdot Vr_{n+1})/4$. Similarly, the virtual sampling $S_{n+2}$ is such that $S_{n+2}=(1\cdot Vr_{n+1}+3\cdot Vr_{n+2})/4$, and the virtual sampling $S_{n+3}$ is such that $S_{n+3}=(1\cdot Vr_{n+2}+3\cdot Vr_{n+3})/4$.

Here, in the section #1, in order to obtain the virtual sampling data $S_{n-1}$, all the four capacitors of the capacitance array for the channel CH16 are used. In the section #2, in order to obtain the virtual sampling data $S_{n+1}$, all the four capacitors of the capacitance array for the channel CH1 are used.

Therefore, since there are no capacitor capacitances usable for composition for forming the ideal sampling data $S_n$, a cycle slip will occur at a timing of switching of the interpolation ratio, resulting in a lack of the virtual sampling data $S_n$. In this way, in conventional data interpolation processing of an asynchronous sampling reception circuit, at a timing when the interpolation ratio is switched, a cycle slip occurs, resulting in a lack of data.

First Embodiment

Next, the receiving device 1 of the present technique will be described below. In a first embodiment of the receiving device 1, a replica of a data interpolation unit (the interpolation unit circuit 11 of FIG. 1) for one channel is provided in parallel with the data interpolation unit in a portion where the interpolation ratio is changed.

Figure 9:
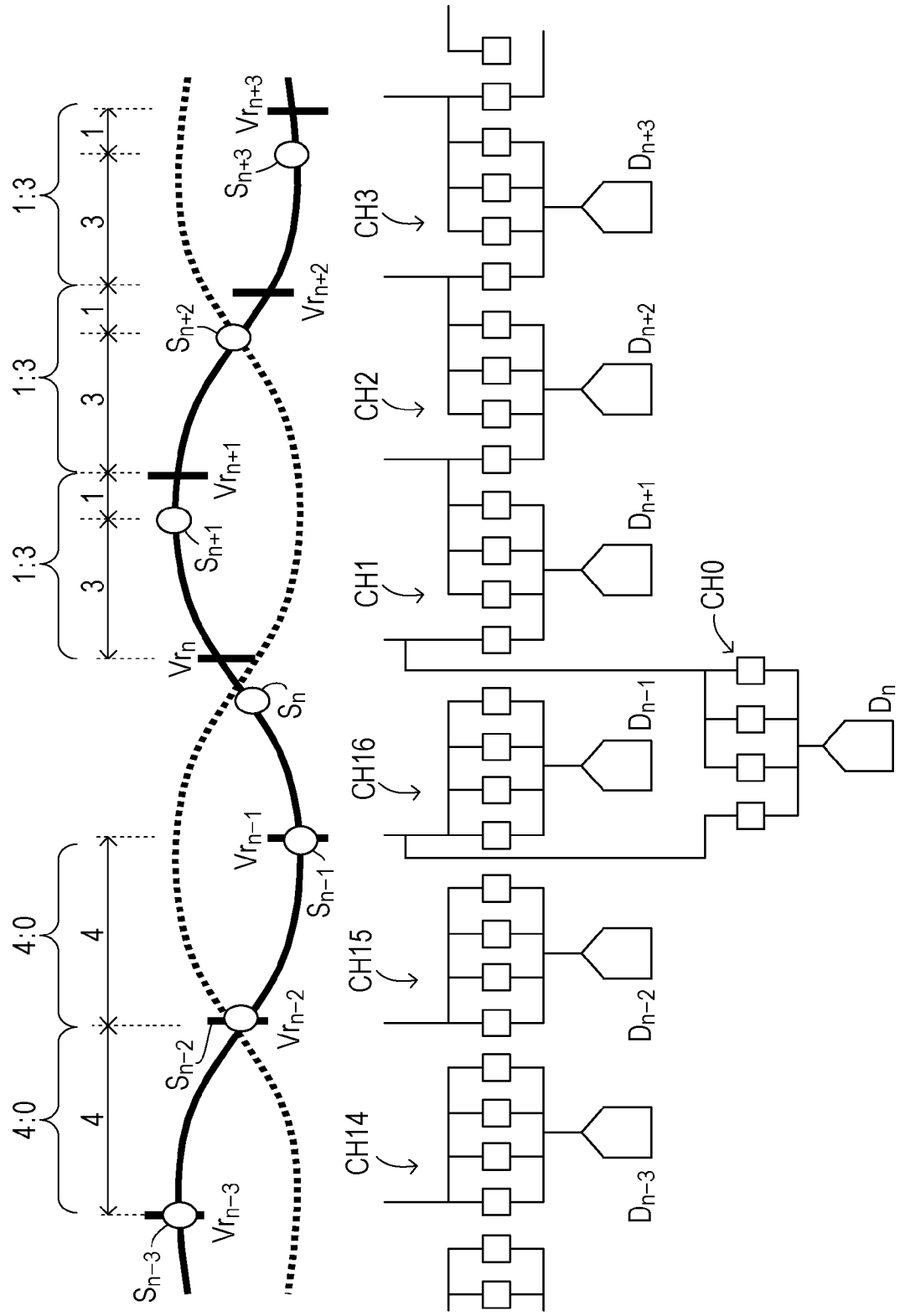
FIG. 9 is a diagram illustrating an operating state of the receiving device.

FIG. 9 is a diagram illustrating an operating state of the receiving device. The operating state at the time of changing an interpolation ratio is illustrated. Under the assumption that the channel positioned at a timing of changing an interpolation ratio is the channel CH0, a data interpolation unit of the channel CH0 is arranged in parallel with a data interpolation unit of the channel CH16 immediately previous to the channel CH0.

Here, in the case of generating virtual sampling data $S_{n-1}$ of the channel CH16, sampling is performed using a total of five capacitances including all the capacitances of four capacitors of the data interpolation unit of the channel CH16 and the capacitance of one capacitor of the data interpolation unit of the channel CH0.

In the case of generating virtual sampling data $S_n$ of the channel CH0, sampling is performed using a total of four capacitances including the capacitances of the remaining three capacitors of the data interpolation unit of the channel CH0 and the capacitance of one capacitor of the data interpolation unit of the channel CH1.

Therefore, because an interpolation output at an interpolation ratio of $S_{n-1}:S_n=1:3$ is also obtained in the channel CH0, a lack of data resulting from a cycle slip does not occur. Therefore, a situation in which there is a lack of data resulting from a cycle slip may be avoided at a timing when the interpolation ratio is switched.

Note that, in this approach, the total number of capacitor capacitances for generation of the virtual sampling data $S_{n-1}$ is five, and the condition of capacitor capacitance loads differs from the conditions for other channels. However, the difference is slight, which presents no practical problem.

Figure 10:
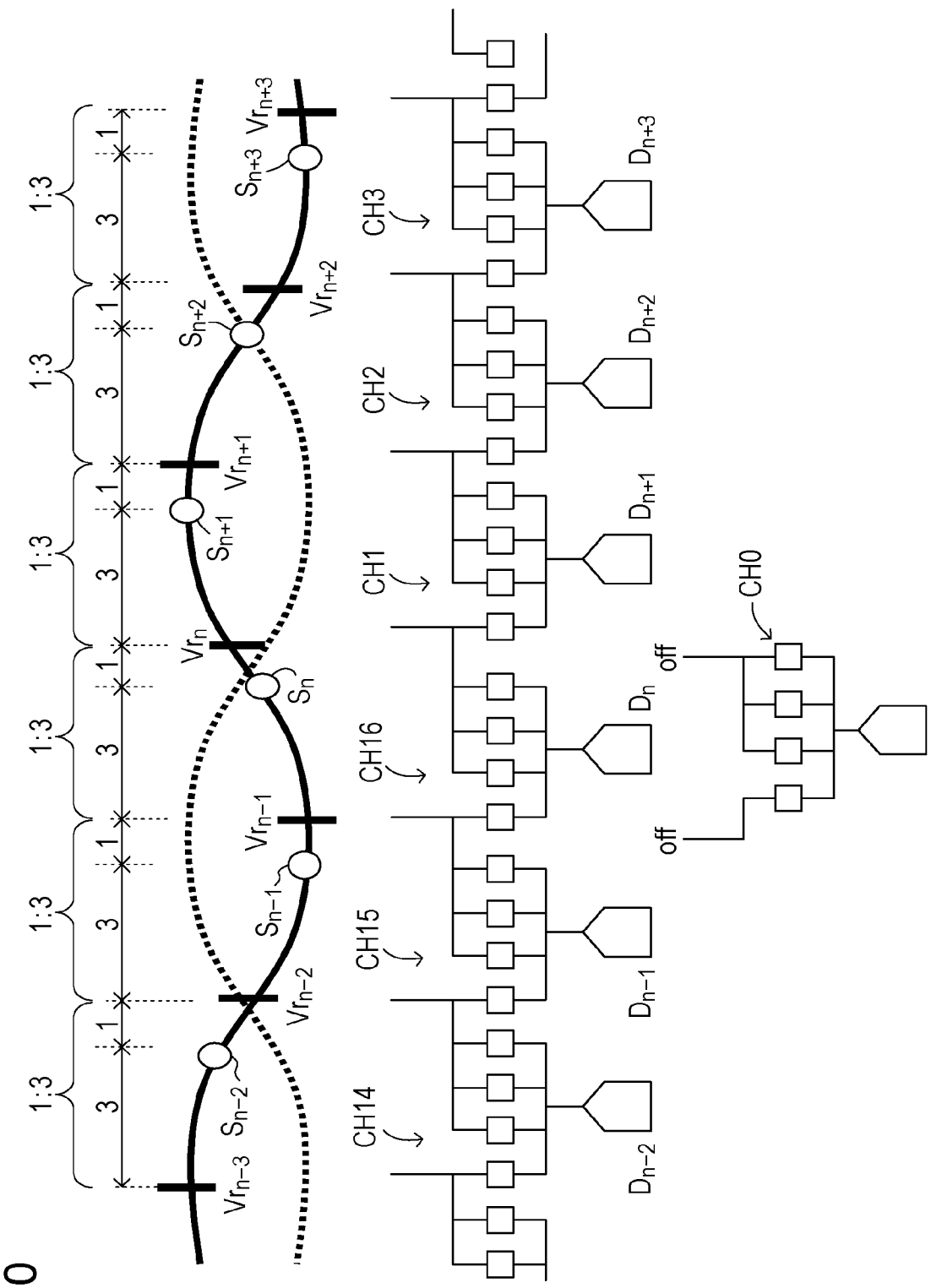
FIG. 10 is a diagram illustrating an operating state of the receiving device.

FIG. 10 is a diagram illustrating an operating state of the receiving device. The state where the receiving device operates when the interpolation ratio is not changed and where operations are performed at an interpolation ratio of 1:3 is illustrated. If the interpolation ratio is not changed, the data interpolation unit of the channel CH0 is unnecessary.

Accordingly, under the condition where the data interpolation unit of the channel CH0 is separate from data interpolation unit arrays of the channels CH1 to CH16, data interpolation processing of input data is performed in the data interpolation units of the channels CH1 to CH16.

Figure 11:
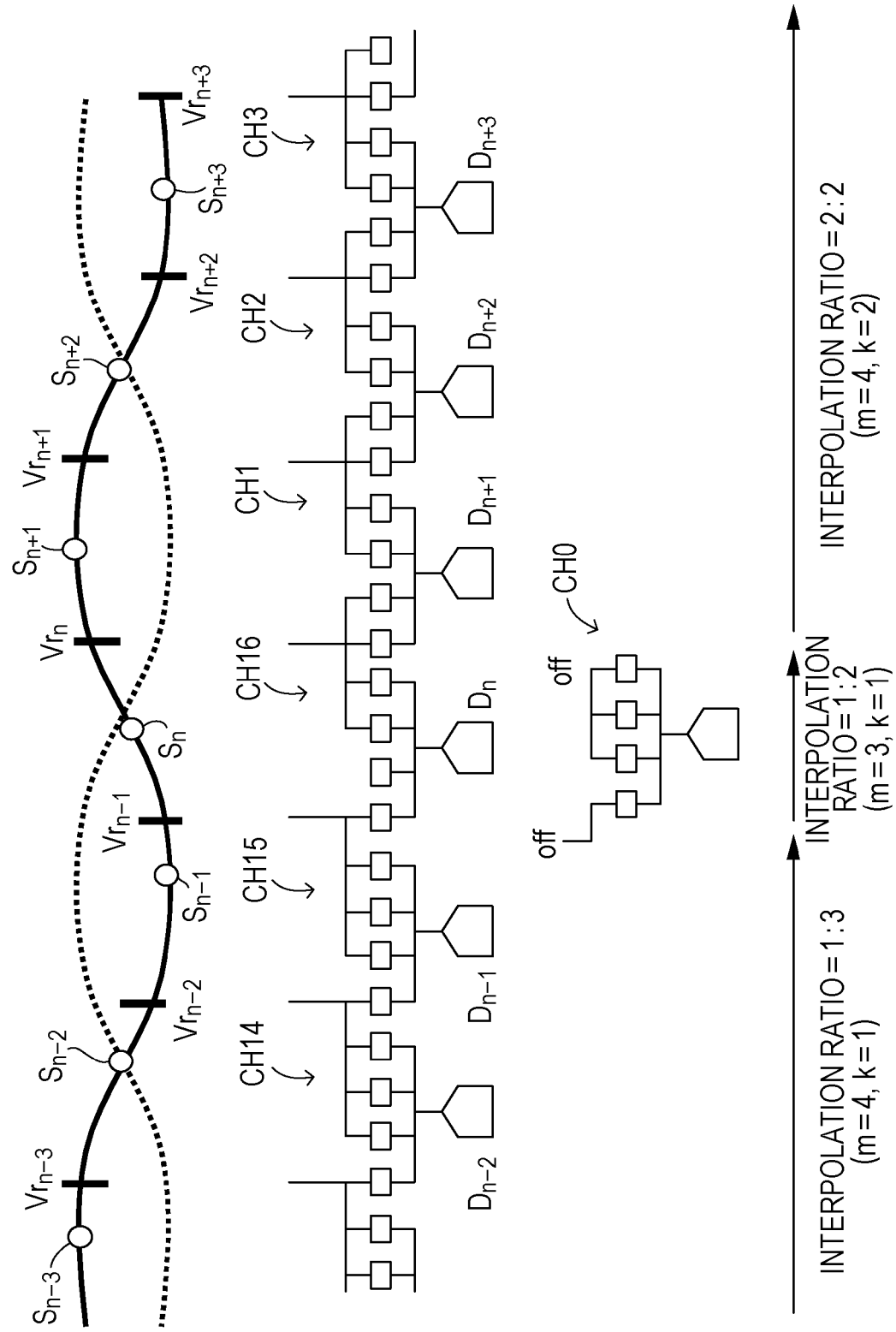
FIG. 11 is a diagram illustrating an operating state of the receiving device.

FIG. 11 is a diagram illustrating an operating state of the receiving device. The state where the receiving device operates at the time of changing the interpolation ratio without the occurrence of a cycle slip is illustrated. The interpolation ratios of the channel CH14 and CH 15 are 1:3, the interpolation ratio of the channel CH16 (=the channel CH0) is 1:2, and the interpolation ratios of the channels CH1, CH2, CH3, . . . are 2:2.

At the time when an interpolation ratio is changed without the occurrence of a cycle slip in such a manner, the data interpolation unit of the channel CH0 is unnecessary. Therefore, under the condition where the data interpolation unit of the channel CH0 is separate from data interpolation unit arrays of the channels CH1 to CH16, data interpolation processing of the channels CH1 to CH16 is performed.

Note that, in FIG. 11, one capacitor of the channel CH16 does not perform sampling operations but operates in the floating state, and the interpolation ratio once changes from 1:3 to 1:2 and then changes to 2:2. With such changes in the interpolation ratio, changeover of the interpolation ratio is smoothly accomplished.

Second Embodiment

A second embodiment of the receiving device 1 will be described next. In the second embodiment, a data interpolation processing unit for one channel is provided in a portion where the interpolation ratio is changed, and, additionally, at least one dummy capacitor in the floating state is added to each channel.

Figure 12:
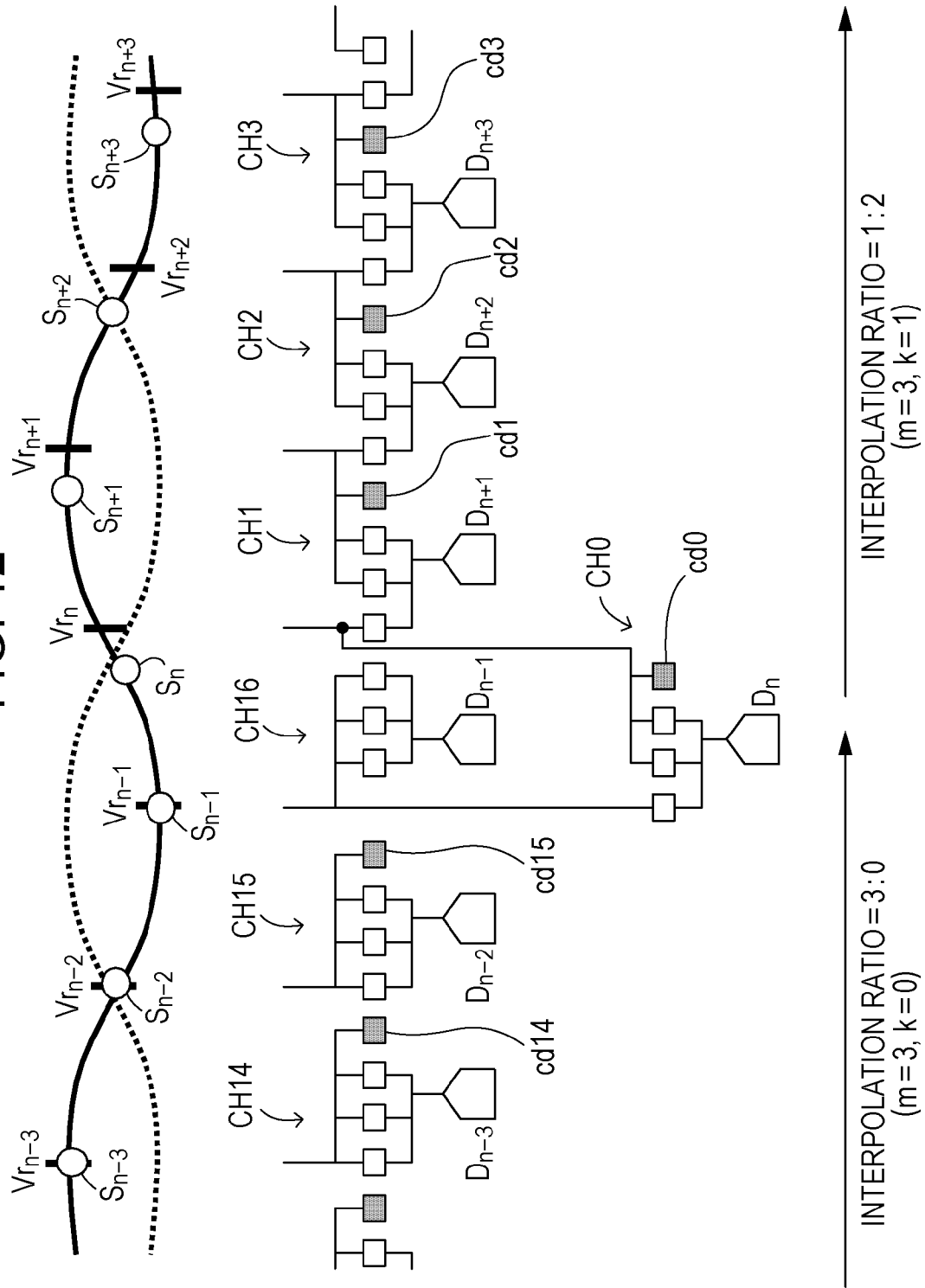
FIG. 12 is a diagram illustrating an operating state of the receiving device.

FIG. 12 is a diagram illustrating an operating state of the receiving device. The state where the receiving device operates at the time of changing the interpolation ratio with the occurrence of a cycle slip is illustrated. The interpolation ratios of the channels CH14 and CH15 are 3:0, and the interpolation ratios of the channels CH0, CH1, CH2, CH3, . . . are 1:2.

In the case of FIG. 12, dummy capacitors cd14, cd15, cd1, cd2, and cd3 are added to the data interpolation units of the channels CH14 and CH15 and the channels CH1, CH2, and CH3. In the data interpolation unit for each of the channel CH16 and the channel CH0, one dummy capacitor cd0 is assigned to the two channels.

With such a configuration, the data interpolation unit of each channel performs data interpolation processing by using the capacitances of three capacitors and the capacitance of one dummy capacitor. This allows an equal load to be achieved in all the channels on the circuit side of driving capacitors, and thus may improve the uniformity of capacitance loads of capacitors.

In the case of operations in a current mode, the relationship of $Q=CV=I \cdot t$ (Q: electric charge, C: capacitance, V: voltage, I: current, t: time) holds here, and operations of the present technique are that an input voltage is converted to a current at an amplifier provided that the time t is fixed, and the current flows to a capacitor, so that the electric charge is stored in the capacitor.

That is, the electric charge of $Q=I \cdot t$ is stored in the capacitor. This concurrently turns out to be a voltage of $V=Q/C$ owing to the relationship of $Q=CV$. Accordingly, as the capacitance varies, the voltage also varies in proportion to the capacitance, and therefore capacitances, which are loads, are preferably uniform among all the channels.

Figure 13:
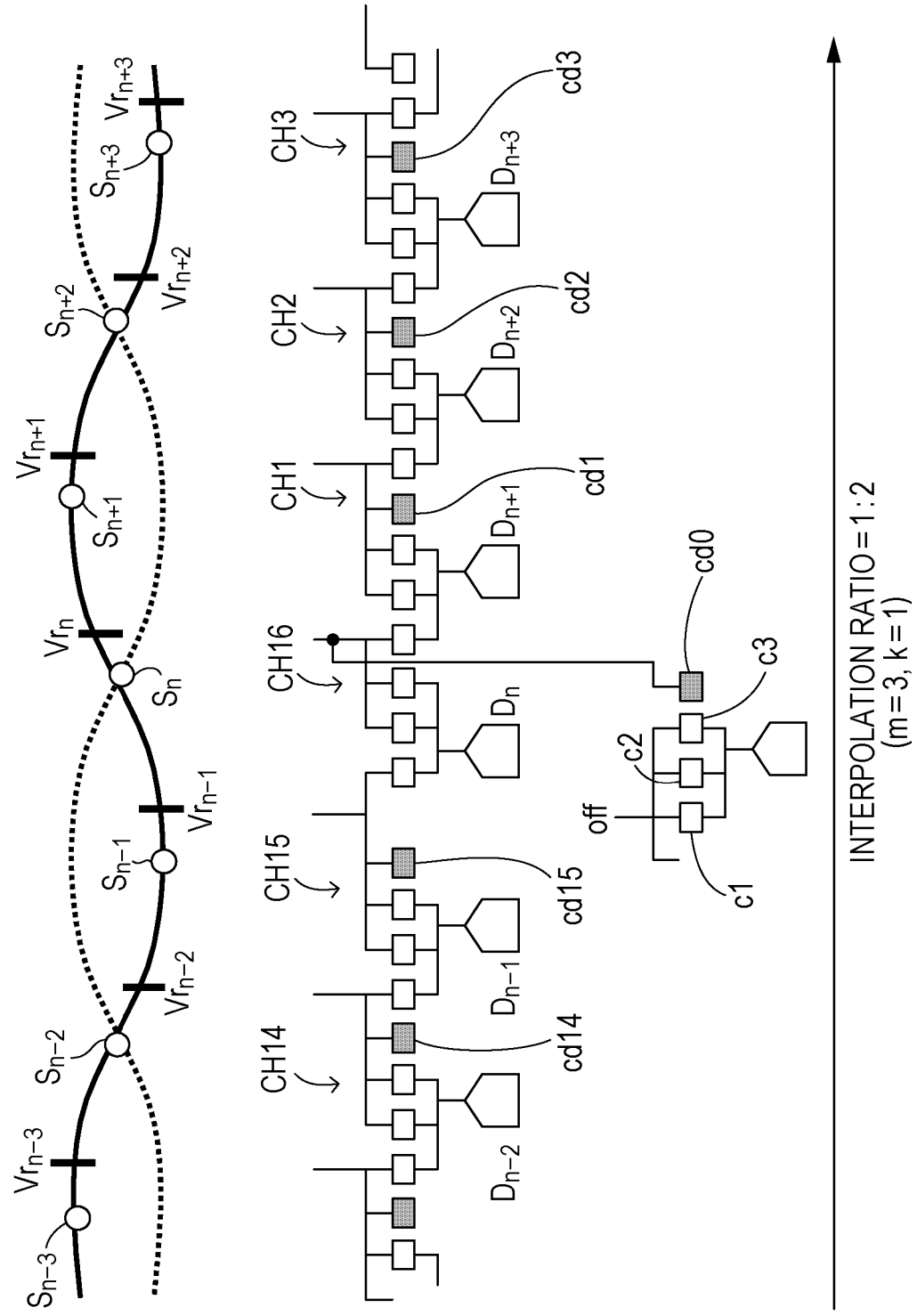
FIG. 13 is a diagram illustrating an operating state of the receiving device.

FIG. 13 is a diagram illustrating an operating state of the receiving device. The state where the receiving device operates when the interpolation ratio is not changed and where operations are performed at an interpolation ratio of 1:2 is illustrated. If the interpolation ratio is not changed, input to three capacitors c1 to c3 of the data interpolation unit of the channel CH0 is in the off state.

With such a configuration, the data interpolation unit of each channel performs data interpolation processing using the capacitances of three capacitors and the capacitance of one dummy capacitor. This allows an equal load to be achieved in all the channels on the circuit side of driving capacitors, and thus may improve the uniformity of capacitance loads of capacitors.

Figure 14:
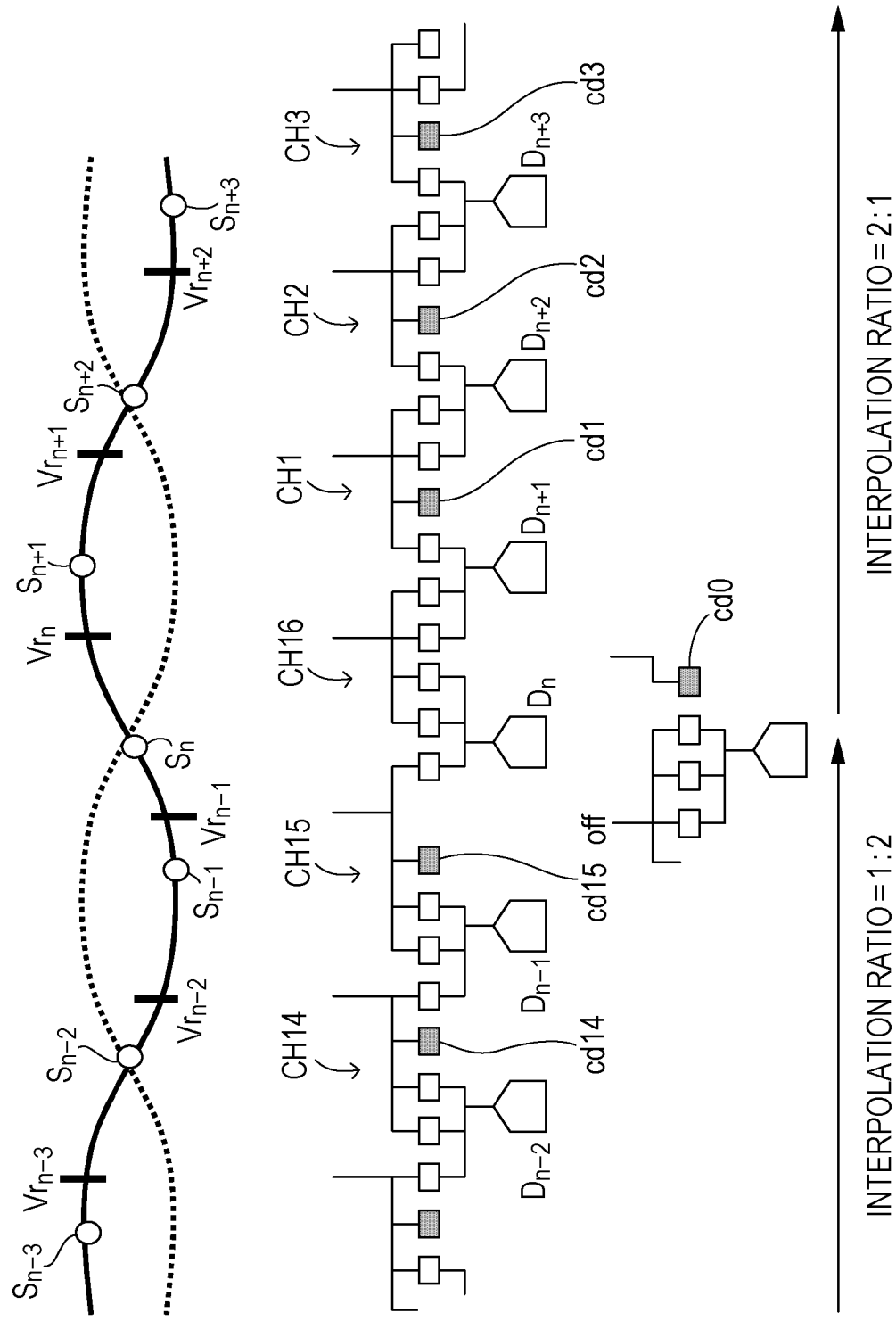
FIG. 14 is a diagram illustrating an operating state of the receiving device.

FIG. 14 is a diagram illustrating an operating state of the receiving device. The state where the receiving device operates at the time of changing the interpolation ratio without the occurrence of a cycle slip is illustrated. The interpolation ratios of the channels CH14, CH15, and CH16 are 1:2, and the interpolation ratios of the channels CH1, CH2, CH3, . . . are 2:1.

At the time when the interpolation ratio is changed without the occurrence of a cycle slip in such a manner, the data interpolation unit of the channel CH0 is unnecessary. Therefore, under the condition where the data interpolation unit of the channel CH0 is separate from data interpolation unit arrays of the channels CH1 to CH16, data interpolation processing of the channels CH1 to CH16 is performed.

Note that, with the configuration of FIG. 14, the data interpolation units of the channels CH14, CH15, CH2, CH3, . . . perform data interpolation processing using the capacitances of three capacitors and the capacitance of one dummy capacitor. Note also that a dummy is not involved at the time of sampling in respective data interpolation units of the channel CH16 and the channel CH1, and therefore loads are not uniform only with such a configuration. However, in the case of a large number of channels, the differences are small, which presents no practical problem.

Third Embodiment

A third embodiment of the receiving device 1 will be described next. In the third embodiment, a data interpolation processing unit for one channel is provided in a portion where the interpolation ratio is changed, and at least one dummy capacitor is added to each channel. Additionally, the output-side node of the dummy capacitor is grounded during sampling.

Figure 15:
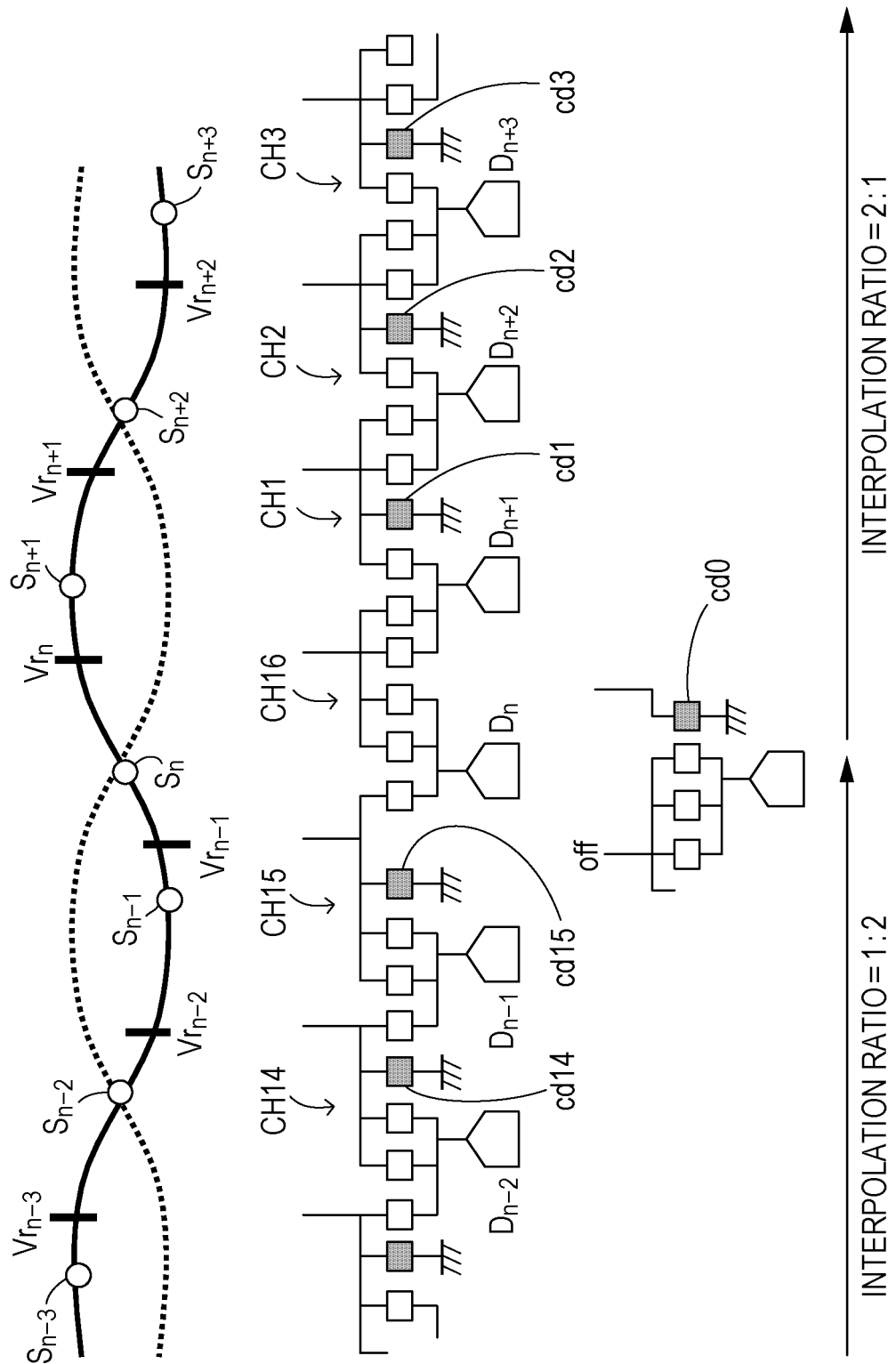
FIG. 15 is a diagram illustrating an operating state of the receiving device.

FIG. 15 is a diagram illustrating an operating state of the receiving device. The state where the receiving device operates at the time of changing the interpolation ratio without the occurrence of a cycle slip is illustrated. The interpolation ratios of the channels CH14, CH15, and CH16 are 1:2, and the interpolation ratios of the channels CH1, CH2, CH3, . . . are 2:1. Note that the output-side nodes of the dummy capacitors cd14, cd15, cd0, cd1, cd2, cd3, . . . are grounded to GND at the time of sampling.

In this way, in FIG. 15, the output-side node of a dummy capacitor, which is floating in the second embodiment, is grounded in the same way as for other capacitors, and data interpolation processing is performed with the capacitances of three capacitors and the capacitance of one dummy capacitor in the data interpolation unit of each channel. This allows an equal load to be achieved in all the channels on the circuit side of driving capacitors, and thus may improve the uniformity of capacitance loads of capacitors.

Figure 16:
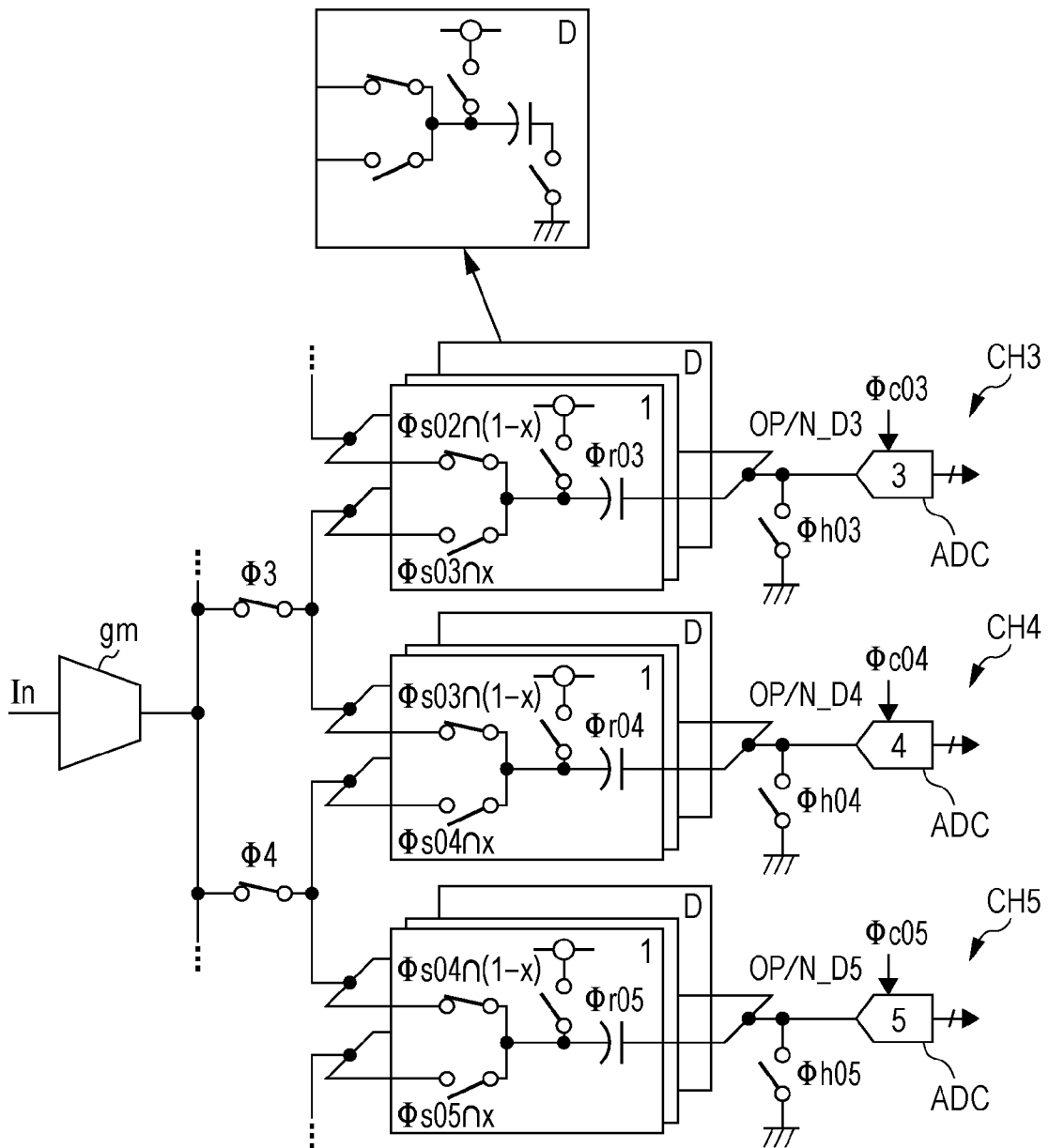
FIG. 16 illustrates a circuit configuration of a data interpolation unit array.
Figure 17:
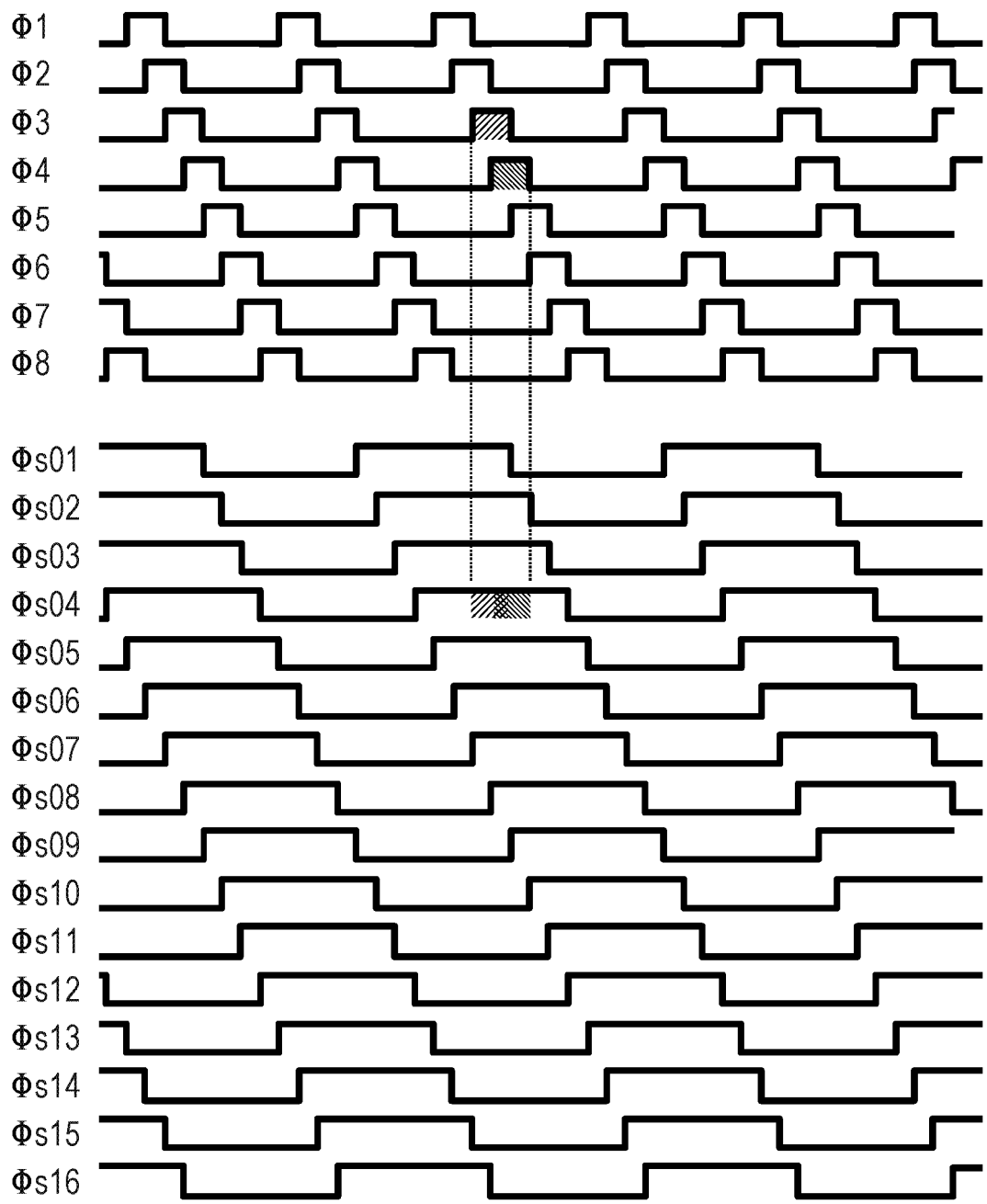
FIG. 17 is a time chart.

Next, the data interpolation unit array will be described with reference to FIG. 16 and FIG. 17. FIG. 16 illustrates a circuit configuration of a data interpolation unit array. FIG. 17 is a time chart. Note that since the connection configuration of basic circuit elements has been described with reference to FIG. 5, description of the connection configuration is omitted.

Sent data In is converted from a voltage to a current by using a gm amplifier. Each channel is made up of a plurality of unit cells made of switched capacitors, and additionally a dummy cell that is not connected with an analog-to-digital converter (ADC) at a later stage. The ADC is capable of reading the original data with a low resolution by analog interpolation processing.

Turning on $\Phi r$ and $\Phi h$ causes each channel to enter the reset state, which, in turn, resets the electric charges of capacitors. In accordance with Os, the interpolation ratio (x:(1-x)) is set. In actual sampling operations, a pull-up switch is turned off when $\Phi r=0$, and subsequently the pull-up switch is turned on when $\Phi 3=1$, so that a capacitor pulled up to Vdd is discharged.

Operations for the channel CH4 positioned at the center of FIG. 16 will be described below. Capacitors (the channels CH3 and CH4) connected with the switch of $\Phi 3$ are discharged only during the period of time when the switch is turned off because $\Phi 3=0$.

At a timing overlapping the timing of $\Phi 3$, $\Phi 4=1$, and the capacitors of the channels CH4 and CH5 are discharged in a manner similar to the above. At this point, the periods of $\Phi 3=1$ and $\Phi 4=1$ overlap; however, the amplifier is independent and therefore interference does not occur between mutual channels. Then, when $\Phi 3=0$ and $\Phi 4=0$, sampling is completed, and thereafter $\Phi h04=0$ is obtained and subsequently $\Phi r04=1$ is obtained.

This causes the output-side (ADC side) node of the capacitor to shift from the GND level by an amount corresponding to a Vdd sampling voltage, and a determination is made by the ADC. Upon completion of the determination, $\Phi h04=1$, and the capacitor is reset and prepares for the next sampling.

Such a configuration as described above is illustrated in an example of 16-channel time interleaving operations in this embodiment. At the time of the occurrence of a time slip, the channel CH0 operates in parallel with the channel CH16. A dummy cell performs a dummy operation synchronous with the corresponding switch of the main circuit.

Note that FIG. 18 illustrates a circuit configuration in the case where the third embodiment illustrated in FIG. 15 is implemented. The channels CH0 and CH1 operate with the setting in which a dummy capacitor C is not included in the channels CH0 and CH1 but is shared by the channels CH0 and CH1. $\Phi 0$ performs on/off operations in synchronization with $\Phi 15$ and $\Phi 16$ only during the occurrence of a cycle slip. The shared dummy C operates in the on state unless switching due to $f_{ext} > f_{int}$ is performed.

As described above, according to the present technique, a plurality of capacitive elements and switches for causing the capacitive elements to perform sampling operations are included, and an additional channel is arranged in such a manner that only one channel is parallel with a specific channel in order to perform switching of the interpolation ratio. This avoids a situation in which there is a lack of data resulting from a cycle slip while controlling an increase in circuit size.

In the present technique, at least one dummy capacitor is arranged in each channel. This may improve the uniformity of load capacitances.

In the foregoing, the embodiments have been described; however, configurations of elements illustrated in the embodiments may be replaced with other elements having similar functions. In addition, other arbitrary constituents and processes may be added.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A receiving device comprising:
a plurality of interpolation unit circuits, each interpolation unit circuit configured to perform interpolation processing of a sampling value obtained by asynchronously sampling input data, based on an interpolation ratio, so that sampling data synchronous with the input data and continuous in time is generated,
wherein one of the interpolation unit circuits is provided in parallel with another of the interpolation unit circuits for a channel previous to a channel in which switching of the interpolation ratio is performed.

2. The receiving device according to claim 1,
wherein the interpolation unit circuit includes a plurality of capacitive elements and a plurality of switches, and is configured to supply the input data to the capacitive elements selected by the switches at a timing of asynchronous sampling, to charge the sampling value of the input data into the capacitive elements at a capacitance ratio based on the interpolation ratio, and to combine electric charges charged into the capacitive elements, so that the sampling data is generated.

3. The receiving device according to claim 2, wherein the interpolation unit circuit includes at least one or more dummy capacitive elements so as to have an equal capacitive load for the interpolation unit circuit for charging the sampling value of the input data into the capacitive load.

4. The receiving device according to claim 3, wherein one or more of the plurality of switches in the interpolation unit circuit causes output-side node of the dummy capacitive elements to be grounded when sampling is performed.

5. A data interpolation processing method, performed by a device, comprising:
interpolating a sampling value obtained by asynchronously sampling input data, based on an interpolation ratio; and
generating sampling data synchronous with the input data and continuous in time,
wherein, when switching of the interpolation ratio from a first interpolation ratio to a second interpolation ratio is performed, the interpolating based on the first interpolation ratio and the interpolating based on the second interpolation ratio are performed for a channel previous to a channel in which the switching from the first interpolation ratio to the second interpolation ratio is performed.

* * * * *